United States Patent [19]
Kinugawa et al.

[11] Patent Number: 5,991,677
[45] Date of Patent: Nov. 23, 1999

[54] BATTERY-DRIVEN WORKING MACHINE

[75] Inventors: Hideki Kinugawa; Masayuki Komiyama, both of Hiroshima, Japan

[73] Assignee: Kabushiki Kaisha Kobe Seiko Sho, Kobe, Japan

[21] Appl. No.: 08/869,138

[22] Filed: Jun. 4, 1997

[30] Foreign Application Priority Data

Jun. 13, 1996 [JP] Japan .................................. 8-152703

[51] Int. Cl.$^6$ ................................ E02F 9/20; E02F 9/24
[52] U.S. Cl. ................................. 701/50; 180/6.2; 37/348
[58] Field of Search ............................. 701/50; 180/6.2; 37/348

[56] References Cited

U.S. PATENT DOCUMENTS

| | | |
|---|---|---|
| 4,066,936 | 1/1978 | Hirota . |
| 4,210,855 | 7/1980 | Harer . |
| 4,723,107 | 2/1988 | Schmid . |
| 5,367,455 | 11/1994 | Kitagawa et al. . |
| 5,416,702 | 5/1995 | Kitagawa et al. . |
| 5,488,787 | 2/1996 | Aoyagi et al. ............................. 37/348 |
| 5,529,134 | 6/1996 | Yomogita ................................. 180/6.2 |
| 5,845,223 | 12/1998 | Song ........................................ 701/50 |

FOREIGN PATENT DOCUMENTS

| | | |
|---|---|---|
| 0844337 | 5/1998 | European Pat. Off. ..................... 9/20 |
| 2 297 183 | 8/1976 | France . |
| 33 39 884 | 5/1985 | Germany . |
| 33 39 890 | 5/1985 | Germany . |
| 43 31 721 | 3/1994 | Germany . |

*Primary Examiner*—William A. Cuchlinski, Jr.
*Assistant Examiner*—Olga Hernandez
*Attorney, Agent, or Firm*—Oblon, Spivak, McClelland, Maier & Neustadt, P.C.

[57] ABSTRACT

There are provided with an electric motor driven by a battery, a hydraulic pump driven by the electric motor, a proximal actuator for actuating a working member by working oil from the hydraulic pump, a hydraulic motor for moving a working machine body, and an operating lever which can be operated between a neutral position and an operating position. There are provided with a control valve capable of cutting off a supply of working oil to the proximal actuator in a state where operating lever is positioned at an operating position, and a battery capacity sensor for detecting the capacity of the battery. There is provided a controller for outputting a control signal for cutting off a supply of working oil to the proximal actuator to the switching control valve in a state where the battery capacity value detected by the battery capacity sensor is at a level lower than a preset battery capacity reference value. It is possible to positively prevent the machine from being immoved at the working site.

20 Claims, 5 Drawing Sheets

BATTERY-DRIVEN WORKING MACHINE

BACKGROUND OF THE INVENTION

1. Field of the Invention

The present invention relates to a battery-driven working machine for carrying out various works by electric power from a battery mounted thereon.

2. Description of the Related Art

A working machine of a battery driving system for carrying civil engineering works by electric power from a battery mounted thereon is disclosed in Japanese Utility Model Laid-Open Hei-4-53846 Publication. In this working machine, an electric motor is driven by electric power from a battery, a hydraulic pump is operated by the drive of the electric motor, a hydraulic motor is driven by working oil discharged from the hydraulic pump, and a working member such as a shovel is operated by the drive of the hydraulic motor.

The working machine of the battery driving type produces less noise than a working machine of an internal combustion engine type using an internal combustion engine as a driving source such as a gasoline engine, a Diesel engine or the like. Further, the working machine of the battery driving type does not discharge exhaust gas. Therefore, this working machine is suitable for works at a city area where buildings are thickly settled.

However, the condensing ability of the mounted battery as a power source of an electric motor is not larger than a fuel storing ability of the working machine of the internal combustion engine type, and therefore the former type machine cannot be used for a long period of time as compared with the latter type machine. Accordingly, the condensing amount of the battery tends to use up dung the operation in the working site. In this case, since the working member becomes disabled, the working machine body cannot be moved and sometimes cannot be moved in the working site.

SUMMARY OF THE INVENTION

An object of the present invention is to provide a battery-driven working machine capable of positively preventing the working machine from being immovable at the working site.

The battery-driven working machine according to the present invention comprises a working machine body having an operator's section in which an operator is occupied; a battery mounted on said operator's section; an electric motor mounted on said operator's section and driven by electric power from said battery, a hydraulic pump mounted on said operator's section and operated by said electric motor; an actuator operated by working oil discharged from said hydraulic pump to operate a working member provided on said working machine body; a working machine moving means for moving the working machine body by said battery; and an operating lever which is operatable between a neutral position for stopping the working member and an operating position at which the working member is operated and in which in a state where said operating lever is positioned at the operating position, working oil is supplied to the actuator. Further, the battery-driven working machine according to the present invention comprises a battery capacity detection means for detecting a capacity of said battery, and an actuator operation limiting means for limiting the operation of said actuator. When the battery capacity value detected by the battery capacity detection means is at a level lower than a preset value, said actuator operation limiting means controls the operation of said actuator without controlling said working machine moving means when said operating lever is operated.

The actuator operation limiting means may be of a type in which the operating speed of the actuator is delayed or of a type in which consumption power consumed by the actuator is minimized. Further, the actuator operation limiting means may be of a type in which the operation of the actuator is stopped.

When the battery capacity value detected by the battery capacity detection means is smaller than a preset reference capacity, the actuator operation limiting means causes the operation speed of the actuator to delay, and when the battery capacity value detected by the battery capacity detection means is smaller than a preset limit capacity which is smaller than the reference capacity, the actuator operation limiting means cause the operation of the actuator to stop.

According to the battery-driven working machine of the present invention, when the capacity of the battery is at a level lower than a preset value, the less-remaining battery capacity can be used merely for moving the working machine to positively prevent the working machine form being immovable at the working site. Accordingly, the work at file work site can be smoothed.

DESCRIPTION OF THE PREFERRED EMBODIMENTS

Figure 1:
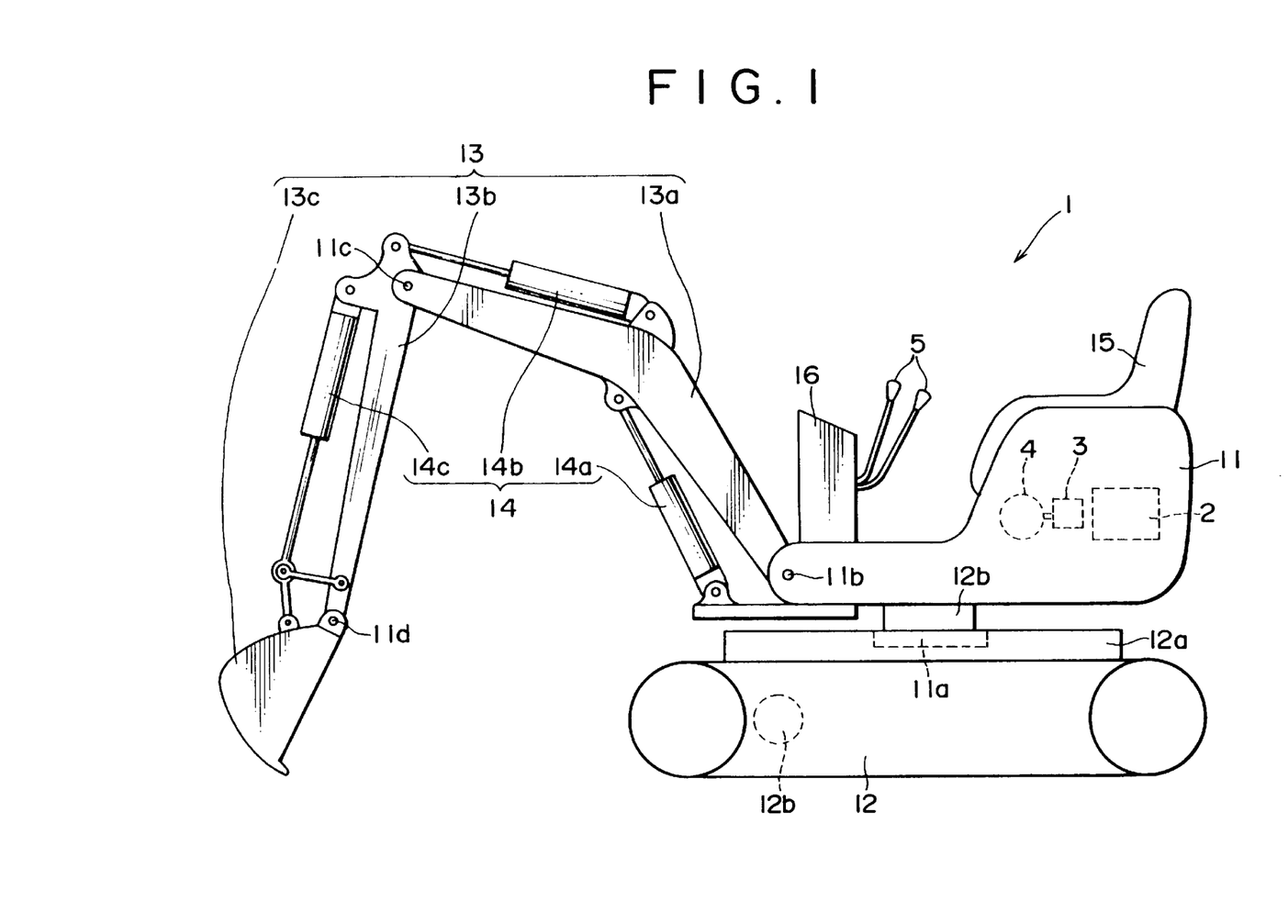
FIG. 1 is a side view showing one embodiment of a working machine according to the present invention.

FIG. 1 is a side view showing one embodiment of a working machine according to the present invention. In this embodiment, there is shown a small excavator as one example of the working machine. An excavator 1 comprises an operator's section 11, a crawler 12, and a working member 13. In the operator's section 11, the operator operates the machine. The crawler 12 is provided at the bottom of the operator's section 11 and used for movement. The working member 13 is provided in front of the operator's section 11 so as to be flexibly by the drive of an actuator 14. The crawler 12 is provided on both sides (both sides vertical to paper surface in FIG. 1) of a base 12a for supporting the same. The operator's section 11 is supported rotatably around a vertical shaft 12b stood upright in the center of the base 12a.

On the base 12a is provided a direction changing actuator 11a for rotating the operator's section 11 around the vertical shaft 12b. By the operation of the actuator 11a, the operator's section 11 can be changed in its horizontal direction with respect to the crawler 12. Further, the crawler 12 is turned by a hydraulic motor 12b provided on the base 12a. Thereby, the excavator 1 can move forward and backward, and change its course. The hydraulic motor 12b is also an actuator.

The working member 13 comprises a proximal-side arm 13a supported rotatably around a horizontal shaft 11b at the front end of the operator's section 11, a front-side arm 13b flexibly provided on the front end of the proximal-side arm 13a, and a shovel 13c flexibly provided on the front end of the front-side arm 13b. The actuator 14 comprises a proximal actuator 14a for rotating the proximal-side arm 13a around the horizontal shaft 11b, an intermediate actuator 14b for rotating the front-side arm 13b around the horizontal shaft 11c, and a front actuator 14c for rotating the shovel 13c around a horizontal shaft 11d. In the present embodiment, the actuators 14a, 14b and 14c are hydraulic cylinders.

A battery 2 is mounted within the operator's section 11. Further, the operator's section 11 is interiorly provided with an electric motor 3 driven by power from the battery 2, and a hydraulic pump 4 driven by the electric motor 3. The operator's section 11 and the base 12a are interiorly provided with a plurality of circulating paths for feeding oil pressure generated by the drive of the hydraulic pump 4 to the actuators 14a, 14b, 14c, and 11a and the hydraulic motor 12b, and a plurality of switching valves for switching the direction of working oil of the hydraulic systems and stopping working oil.

A driver's seat 15 seated by an operator to drive the excavator 1 is provided at the rear (rightward in FIG. 1) of the operator's section 11. An operating stand 16 opposed to the driver's seat 15 is stood upright in front of the operator's section 11. A plurality of operating means 5 corresponding to the actuators 14a, 14b, 14c and 11a, and the hydraulic motor 12b are provided on the operating stand 16. By operation of these operating means 5, a supply or a stop of supply of working oil to the actuators 14a, 14b, 14c and 11a, and the hydraulic motor 12b are performed through the switching valves whereby the actuators 14a, 14b, 14c and 11a, and the hydraulic motor 12b are driven or stopped.

Figure 2:
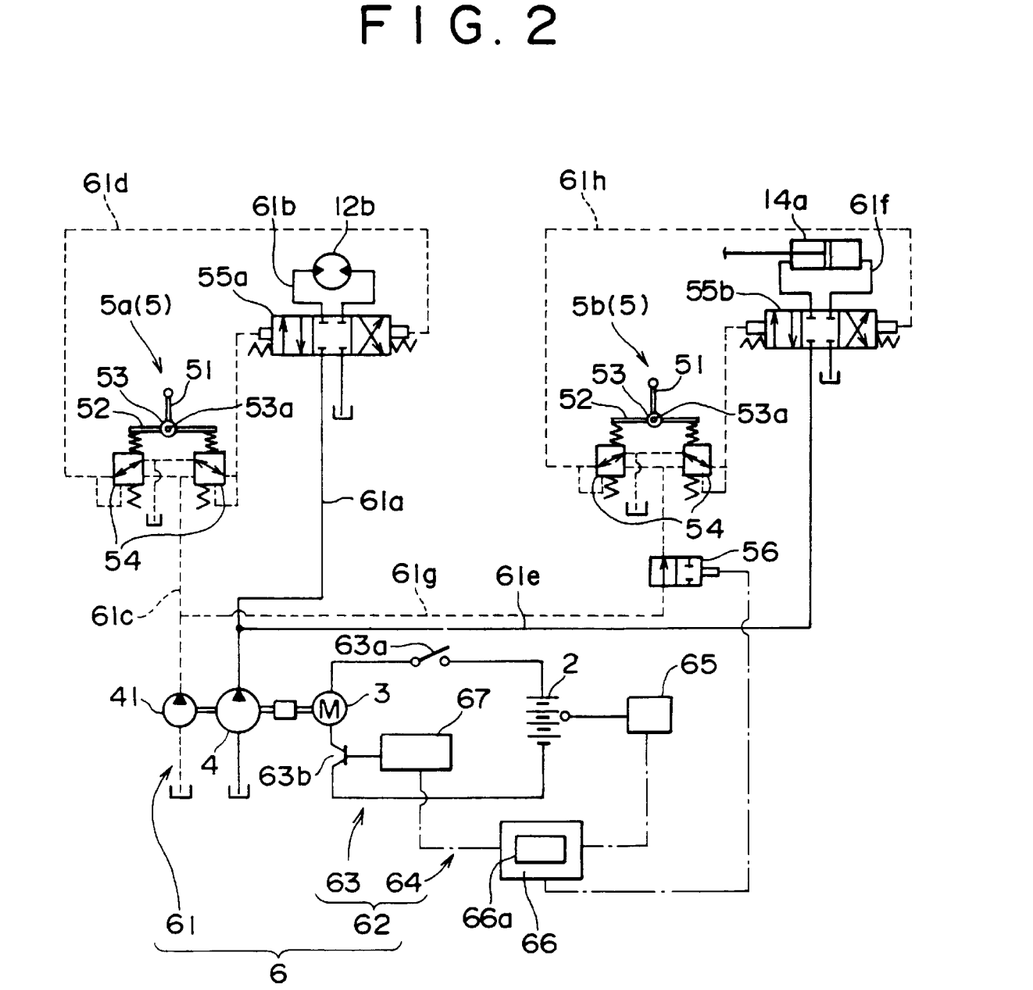
FIG. 2 is a control circuit view showing one embodiment of a driving system according to the present invention.

FIG. 2 is a control circuit view showing one embodiment of a driving system according to the present invention. In FIG. 2, the system relating to the hydraulic motor 12b and the system relating to the proximal actuator 14a out of a plurality of hydraulic systems are extracted for simplification of explanation. As shown in FIG. 2, a driving system 6 is composed of a hydraulic system 61 and an electric system 62. The hydraulic system 61 has the hydraulic pump 4, a pilot pump 41 coaxial with the hydraulic pump 4, a first operating means 5a and a first directional control valve 55a relating to the hydraulic motor 12b, and a second operating means 5b and a second directional control valve 55b relating to the hydraulic motor 12b. The hydraulic motor 12b is rotated by the working oil discharged from the hydraulic pump 4. The directional control valves 55a and 55b are switched by pilot oil discharged from the pilot pump 41.

A first hydraulic pipeline 61a is disposed between the hydraulic pump 4 and the first directional control valve 55a. A second hydraulic pipeline 61b is disposed between the first directional control valve 55a and the hydraulic motor 12b. When the first directional control valve 55a is opened, the working oil discharged from the hydraulic pump 4 is circulated through the first hydraulic pipeline 61a and the second hydraulic pipeline 61b. Thereby, the hydraulic motor 12b disposed in the second hydraulic pipeline 61b is rotated in a predetermined direction. When the first directional control valve 55a is closed, the rotation of the hydraulic motor 12b stops.

Further, a first pilot pipeline 61c is disposed between the pilot pump 41 and the first operating means 5a. A second pilot pipeline 61d is provided between the first operating means 5a and the first directional control valve 55a. Pilot oil is discharged from the pilot pump 41 and reaches the first operating means 5a through the first pilot pipeline 61c. Further, the pilot oil is started or stopped to be supplied to the second pilot pipeline 61d by the operation of the first operating means 5a. Thereby, the hydraulic motor 12b is rotated in a predetermined direction or stopped.

A third hydraulic pipeline 61e is disposed between the hydraulic pump 4 and the second directional control valve 55b. A fourth hydraulic pipeline 61f is provided between the second directional control valve 55b and the proximal actuator 14a. When the second directional control valve 55b is opened, the working oil discharged from the hydraulic pump 4 is circulated through the third hydraulic pipeline 61e and the fourth hydraulic pipeline 61f. Thereby, the proximal actuator 4a disposed in the fourth hydraulic pipeline 61f is operated in a predetermined direction. When the second directional control valve 55b is closed, the proximal actuator 14a stops its operation.

A third pilot pipeline 61g is disposed between the pilot pump 41 and the second operating means 5b. A fourth pilot pipeline 61h is provided between the second operating means 5b and the second directional control valve 55b. The pilot oil is discharged from the pilot pump 41 and reaches the second operating means 5b through the third pilot pipeline 61g. By the operation of the second operating means 5b, the pilot oil starts or stops to be supplied to the fourth pilot pipeline 61h. The second directional control valve 55b is located according to the operation of the second operating means 5b whereby the proximal actuator 14a is operated in a predetermined direction or stops.

A control valve 56 is disposed in the third pilot pipeline 61g. In case of this embodiment, this control valve 56 functions as a working oil cutoff means. When the control valve 56 is closed, a supply of pilot oil to the second operating means 5b is cutoff. A supply of pilot oil to the second operating means 5b is cutoff whereby a supply of pilot oil to the second directional control valve 55b through the second operating means 5b is cutoff. Thereby, the second directional control valve 55b is closed so as to cutoff the flow of working oil. In this state, even if the second operating means 5b is operated to an operating position, the proximal actuator 14a is not operated.

The operating means 5a, 5b are each provided with an operating lever 51 protruded upward from the operating stand 16. These operating levers 51 are rod-like. A bearing portion 53 is provided at the proximal end of each operating lever 51. A support shaft 53a is fitted into each bearing portion 53. The operating lever 51 is supported rotatably around the support shaft 53a.

The bearing portion 53 is provided with a lateral lever 52 extending in a lateral direction. A pair of switching valves 54 are provided at lower portions on both sides of the lateral lever 52 through coil springs, respectively. Usually, the operating means 5 is set to a stood-upright neutral position by the force of the coil spring. In the state where the operating means 5 is at a neutral position, the directional control valves 55a, 55b are set to an operating oil cutoff position, as shown in FIG. 2. Accordingly, usually, the hydraulic motor 12b and the proximal actuator 14a are in a stop state.

When an operator moves down the operating lever in one direction around the support shaft 53a, one switching valve 54 is opened while the other switching valve 54 is closed. Thereby, the flowing direction of pilot oil supplied to the second hydraulic pipeline 61b is set so that the hydraulic motor 12b rotates in one direction, and the proximal actuator 14a operates in one direction. Conversely, when the operating lever 51 is moved down in the other direction, the hydraulic motor 12b rotates in the other direction, and the proximal actuator 14a operates in the other direction.

The electric system 62 comprises a loop circuit 63 in which the battery 2 and the electric motor 3 are connected in series, and a control circuit 64 for controlling a voltage applied to the electric motor 3 of the loop circuit 63. The loop circuit 63 is provided with a key switch 63a and a transistor (switch element) 63b. A base of the transistor 63b is connected to a chopper circuit 67. The chopper circuit 67 performs duty ratio control. The key switch 63a is turned on when the excavator 1 performs its operation. When the key switch 63a is turned on, power from the battery 2 is supplied to the electric motor 3 so that the electric motor 3 is driven.

The control circuit 64 is provided with a battery capacity sensor 65 for detecting a capacity (voltage) of the battery 2, a control means 66 for outputting a predetermined control signal to the loop circuit 63 according to the detected result of the battery capacity sensor 65, and a chopper circuit 67 for outputting a pulse signal to the loop circuit 63 according to the control signal from the control means 66. A control signal for opening and closing the control valve 56 is output from the control means 66.

Figure 3:
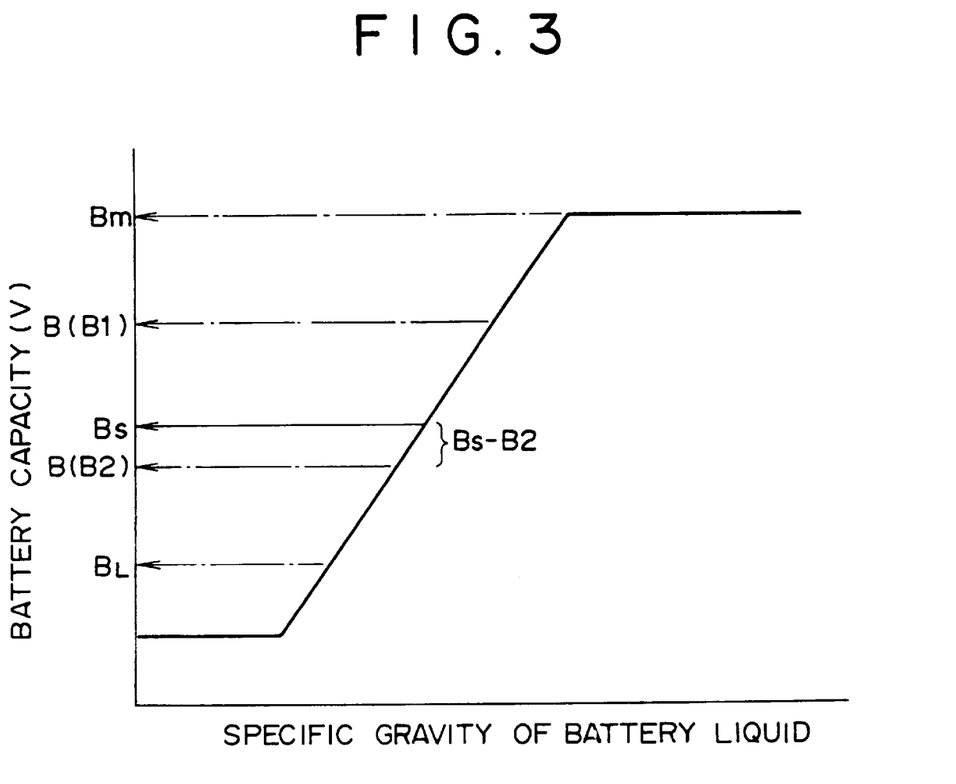
FIG. 3 is a graph illustrating a relationship between a specific gravity of battery liquid and a capacity of a battery.

In the present embodiment, a specific gravity meter is applied as the battery capacity sensor 65. Specific gravity of battery liquid is measured by the specific gravity meter to thereby detect the capacity of the battery 2. FIG. 3 is a graph illustrating a relationship between a specific gravity of battery liquid and a capacity of a battery. As shown in this graph, the capacity of the battery is proportional to the specific gravity of the battery liquid between 0 (V) and the maximum capacity Bm (V). In the present embodiment, the specific gravity of the battery liquid is detected by the specific gravity meter to thereby detect the capacity of the battery 2 making use of the relationship therebetween in the FIG. 3 graph.

The chopper circuit 67 outputs a DC current in a given period. In the present embodiment, a pulse signal having a predetermined pulse according to the control signal from the control means 66 is output.

The control means 66 performs the control of the general operation of the excavator 1. The control means 66 has a voltage control portion 66a for controlling a voltage applied to the electric motor 3 according to the detected value of the battery capacity sensor 65. The voltage control portion 66a outputs a control signal to the chopper circuit 67 so that a pulse voltage having a duty ratio according to the detected voltage value is applied to the electric motor 3.

More specifically, as shown in FIG. 3, a reference capacity Bs is previously set to a predetermined level lower than the maximum battery capacity Bm (V) of the battery 2. The value of the reference capacity Bs is stored in the voltage control portion 66a. When, for example, a capacity B detected by the battery capacity sensor 65 is B1 at a level higher than the reference capacity Bs, a control signal is output to the chopper circuit 67 from the voltage control portion 66a so that a current continuously flows to the base of the transistor 63b whereby the transistor 63b assumes a state in which the switch is always turned on, and a predetermined voltage (1 (V)) is applied to the electric motor 3 from the battery 2.

In this state, the electric motor 3 is driven, and the hydraulic pump 4 is driven accordingly whereby the hydraulic motor 12b and the proximal actuator 14a are operated so that the excavator 1 can be operated normally.

When the capacity B detected by the battery capacity sensor 65 is B2 at a level lower than the reference capacity Bs, a control signal is output to the chopper circuit 67 from the voltage control portion 66 so that a voltage Vd obtained by deducting a voltage value (k×(Bs−B2), where k is proportional constant (k>1)) proportional to a difference between the reference capacity Bs and the detected capacity B2 from the reference capacity Bs is applied to the electric motor 3. This voltage control is carried out by converting an electromotive force of the battery 2 into a pulse voltage by the transistor 63b to make it into a predetermined duty ratio so that a mean voltage value is the deducted voltage Vd.

Accordingly, when the detected capacity B is "B2" at a level lower than the reference capacity Bs, the operating speed of the hydraulic motor 12b and the proximal actuator 14a are slow, but the power consumption is small accordingly.

A limit capacity BL of the battery 2 is previously input into the control means 66. When the detected capacity B is at a level lower than the limit capacity BL, a control signal is output to the switching control valve 56 from the voltage control portion 66. Thereby, a supply of the pilot oil from the pilot pump 41 to the second operating means 5b is cutoff. That is, the proximal actuator 14a cannot be operated in the state where the detected capacity B of the battery 2 is at a level lower than the limit capacity BL. Thereby, the hydraulic motor 12b can be driven to move the excavator 1 without wasting the less-remaining capacity of the battery 2. Thereby, it is possible to prevent the excavator from being disabled in the working site.

When the detected capacity B is between the reference capacity Bs and the limit capacity BL, the voltage control portion 66a outputs a control signal to the chopper circuit 67 so that the duty ratio is calculated so that the detected capacity B2 is the deducted voltage Vd to obtain the duty ratio on the basis of a program stored in advance on the basis of the detected capacity B of the battery capacity sensor 65. The chopper circuit 67 intermittently outputs a signal for fling the duty ratio to the base of the transistor 63b. The transistor 63b performs on-off operation at a predetermined tiring. Thereby, a current is intermittently supplied to the electric motor 3 in a state where the duty ratio is fulfilled, and a pulse voltage which is the deducted voltage Vd on the average is applied to the electric motor 3.

When the detected capacity B of the battery 2 is at a level lower than the reference capacity Bs, the hydraulic motor 12b and the proximal actuator 14a can be operated in a state where the capacity of the battery 2 is not rapidly lowered by the first operating means 5a and the second operating means 5b.

Figure 4:
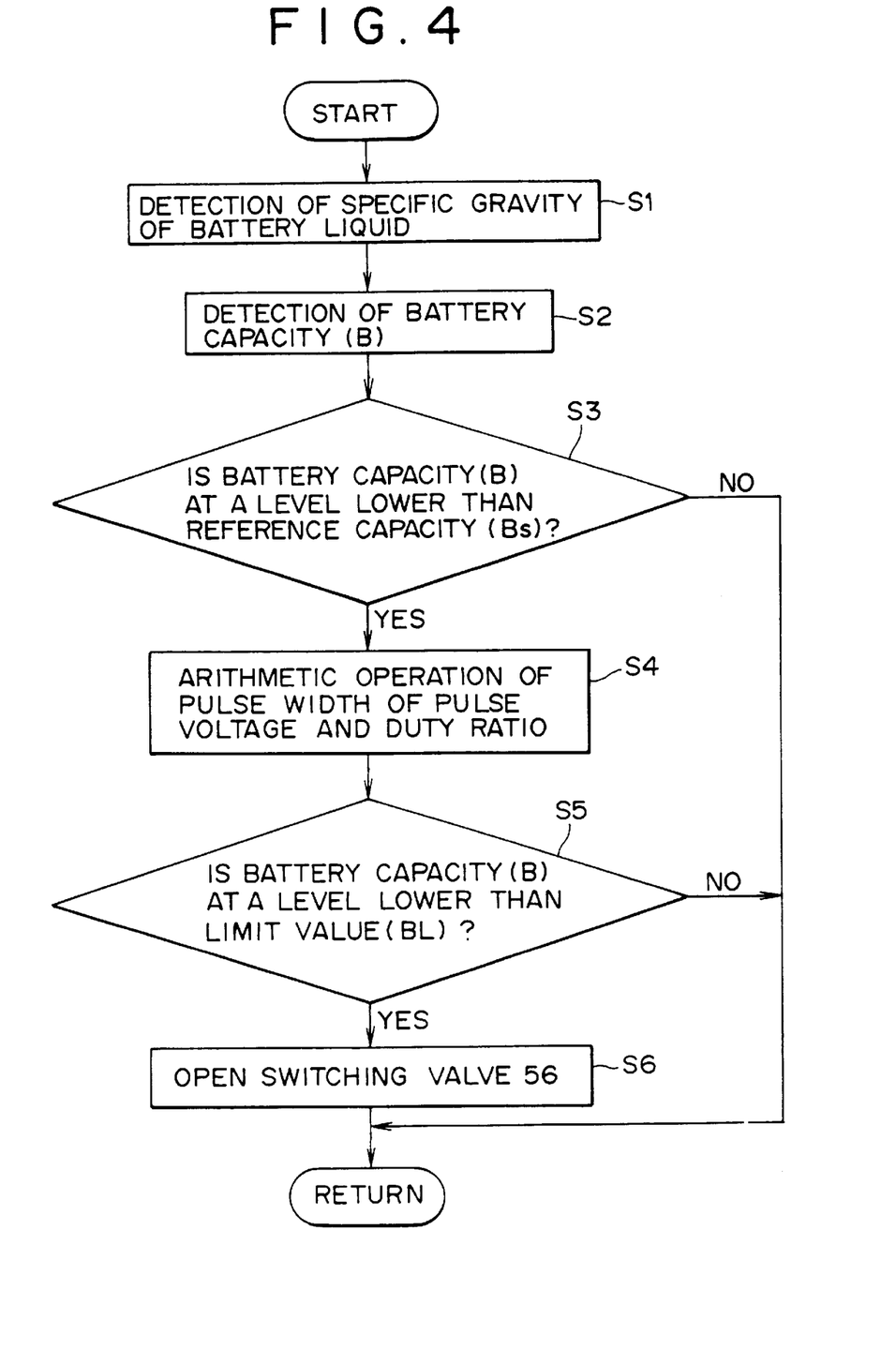
FIG. 4 is a flow chart showing one embodiment of the control by the control circuit.
Figure 5A:
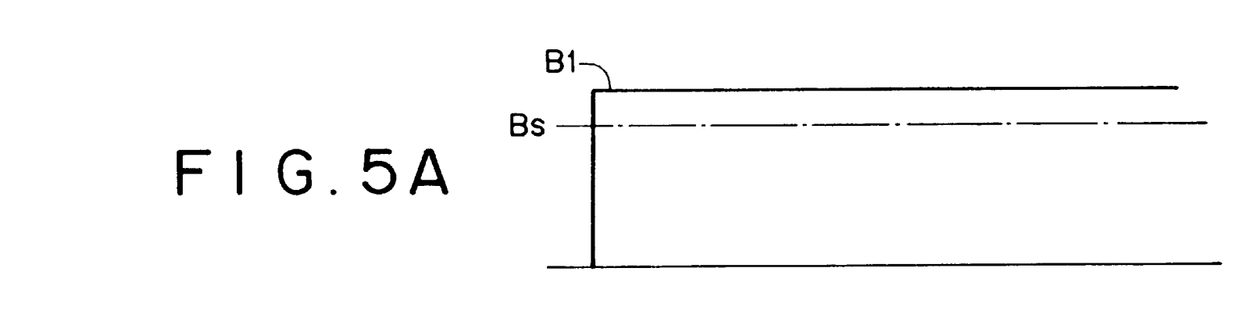
FIG. 5 shows waveforms illustrating a relationship between a detection capacity of a battery capacity sensor and a voltage applied to an electric motor.
Figure 5B:
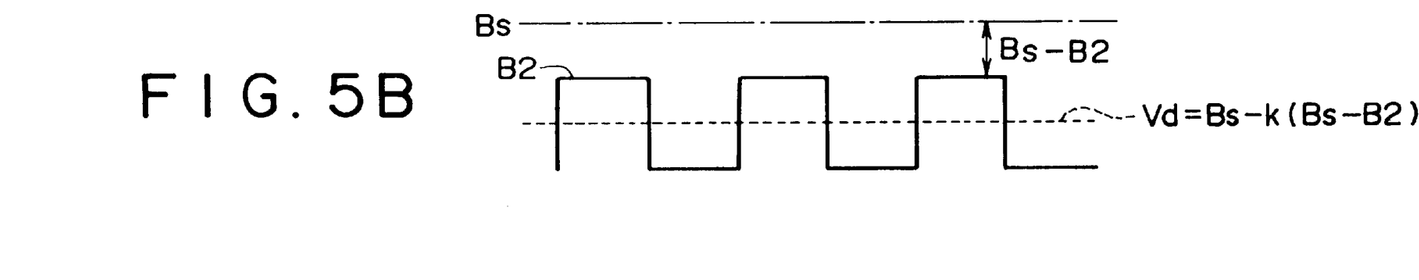

The operation of the present invention will be described hereinafter with reference to FIGS. 4 and 5. FIG. 4 is a flow chart showing one embodiment of the control by the control circuit 64; and FIG. 5 shows waveforms illustrating a relationship between the detected capacity B of the battery capacity sensor 65 and a voltage applied to the electric motor 3. (A) shows the state where the detected capacity B1 is at a level higher than the reference capacity Bs, and (B) shows the state where the detected capacity B1 is at a level lower than the reference capacity Bs.

When the key switch 63a is turned on, the control circuit 64 is energized, and the hydraulic pump 4 is operated by the supply of power to the electric motor 3 from the battery 2 to render the excavator 1 operatable. In this state, the steps shown in FIG. 4 is executed in the control means 66. First, in Step S1, the specific gravity of battery liquid is detected by the battery capacity sensor 65, and in Step S2, the detected result is input into the control means 66, where the value of the specific gravity is converted into the voltage value (detected capacity B). Then, in Step S3, the voltage control portion 66a determines whether or not the detected capacity B is at a level lower than the preset reference capacity Bs. When the detected capacity B is "NO" which is a level higher than the reference capacity Bs, the procedure is returned to Step S1. In this state, a voltage corresponding to the detected capacity B1 at a level higher than the reference capacity Bs is continuously applied to the electric motor 3, as shown in FIG. 5 (A), and the hydraulic pump 4 is operated by the drive of the electric motor 3 so that in the excavator 1, the hydraulic motor 12b and the proximal actuator 14a are placed in a normal operatable condition capable of being operated by the operation of the operating means 5.

In Step S3, when the detected capacity B is "YES" which is a level lower than the reference capacity Bs, Step S4 is executed. That is, in Step S4, a value obtained by multiplying a difference between the reference capacity Bs and the detected capacity B2 by a predetermined constant k (k>1) is deducted from the reference capacity Bs (Bs−k×(Bs−B2)), and a pulse voltage of the resultant calculated value, that is, the deducted voltage Vd is applied to the electric motor 3. This pulse voltage is obtained by the control of the duty ratio so that an average value is the deducted voltage Vd, as shown in FIG. 5 (B). In Step S5, whether or not the detected capacity B2 is at a level lower than the limit capacity BL is determined. When the detected capacity B2 is "NO" which is a level higher than the limit capacity BL, the procedure is returned to Step S1. Conversely, when the detected capacity 2 is "YES" which is a level lower than the limit capacity BL, the procedure is shifted to Step S6. In Step S6, the switching control valve 56 is closed by the control signal from the control means 66 whereby even if the second operating means 5b is operated, the pilot oil is not supplied to the second directional control valve 55b. For this reason, the proximal actuator 14a assumes a state where the operation thereof is locked.

As described in detail above, according to the present invention, the capacity of the battery 2 is always detected by the battery capacity sensor 65 during the operation of the excavator 1, and when the detected capacity B is at a level lower than the preset reference capacity Bs, a pulse voltage at a potential lower than the reference capacity Bs is applied to the electric motor 3, thus suppressing the power consumption of the battery 2 accordingly and enabling the extension of the used-up of the battery.

The transistor 63b is turned on and off by the duty ratio according to the operating amount of the operating lever 51 by the operation of the voltage control portion 66a and the chopper circuit 67. Therefore, for example, as compared with an arrangement wherein a voltage from the battery 2 is supplied to the electric motor 3 through a variable resistor, it is possible to extend the service life of the battery 2 by a portion involved no power consumption by the resistor to enable the operation of the excavator 1 for a long period of time.

Further, when the detected capacity B2 is at a level lower than the limit capacity BL, even if the second operating means 5b is operated to the operating position by opening and closing the control valve 56, the proximal actuator 14a will not be operated. For this reason, it is possible to effectively use the less-remaining capacity of the battery 2 only for the operation of the excavator 1. It is possible to positively prevent the excavator 1 from being not moved in the working site in the midst of work.

The present invention is not limited to the aforementioned embodiment but includes the following:

(1) While in the above-described embodiment, a description has been made of the drive control with respect to the actuator 14, giving the proximal actuator 14a as an example, it is to be noted that the object to be controlled is not limited to the proximal actuator 14a but the present invention can be applied to other actuators such as the intermediate actuator 14b and the front actuator 14c.

(2) While in the above-described embodiment, the capacity of the battery 2 has been detected by measuring the specific gravity of the battery liquid, the capacity of the battery 2 may be detected by a conventional voltmeter.

(3) While in the above-described embodiment, the control valve 56 has been provided in the third pilot pipeline 61g for feeding pilot oil to the second operating means 5b, it is to be noted that the control valve 56 may be provided in the third hydraulic pipeline 61e for feeding working oil.

(4) While in the above-described embodiment, the working machine has been described giving the crawler type excavator 1 as an example, it is to be noted that a wheel type excavator may be employed, or other working machines, for example, such as a crane, a loader, etc. may be employed.

We claim:

1. A battery-driven working machine comprising:
    a working machine body;
    a battery mounted on said working machine body;
    an electric motor mounted on said working machine body and driven by electric power from said battery;
    a hydraulic pump mounted on said working machine body and operated by said electric motor;
    an actuator operated by working oil discharged from said hydraulic pump to operate a working member provided on said working machine body;
    a working machine moving means for moving said working machine body by electric power from said battery;
    an operating lever which is operable between a neutral position for stopping said working member and an operating position at which said working member is operated and when said operating lever is positioned at the operating position, working oil is supplied to said actuator;
    a battery capacity detection means for detecting the capacity of said battery; and
    an actuator operation limiting means for limiting an operation of said actuator and said working machine moving means by reducing the power supplied to said electric motor from a continuous application of power to a series of pulses when said operating lever is operated, in a case where a battery capacity value detected by said battery capacity detection means is at a level lower than a preset value and above a preset, lower limit value.

2. The battery-driven working machine according to claim 1,
    wherein said actuator operation limiting means causes a operating speed reduction of said actuator.

3. The battery-driven working machine according to claim 1,
    wherein said actuator operation limiting means causes a reduction in power consumed by said actuator.

4. The battery-driven working machine according to claim 1,
    wherein said actuator operation limiting means causes operation of said actuator to stop when a detected battery capacity is below said preset, lower limit value.

5. The battery-driven working machine according to claim 1, wherein the working machine is a hydraulic excavator.

6. The battery-driven working machine according to claim 5, wherein said actuator is a hydraulic cylinder for rotating an arm.

7. The battery-driven working machine according to claim 6,
wherein when the battery capacity value detected by said battery capacity detection means is at a level lower than said preset, lower limit value, said actuator operation limiting means causes operation of said hydraulic cylinder to stop.

8. The battery-driven working machine according to claim 1,
wherein said battery capacity detection means detects a specific gravity of battery liquid.

9. The battery-driven working machine according to claim 1,
wherein said battery capacity detection means is a voltmeter.

10. A battery-driven working machine comprising:
a working machine body;
a battery mounted on said working machine body;
an electric motor mounted on said working machine body and driven by electric power from said battery;
a hydraulic pump mounted on said working machine body and operated by said electric motor;
an actuator operated by working oil discharged from said hydraulic pump to operate a working member provided on said working machine body;
a moving mechanism adapted to move said working machine body by electric power from said battery;
an operating lever which is operable between a neutral position for stopping said working member and an operating position at which said working member is operated and when said operating lever is positioned at the operating position, working oil is supplied to said actuator;
a battery capacity detector adapted to detect the capacity of said battery; and
a voltage control mechanism adapted to limit an operation of said actuator and said working machine moving mechanism by reducing said electric power supplied to said electric motor from a continuous application of power to a series of power pulses when said operating lever is operated, in a case where a battery capacity value detected by said battery capacity detection means is at a level lower than a preset value and above a preset, lower limit value.

11. The battery-driven working machine according to claim 10,
wherein said voltage control mechanism causes a operating speed reduction of said actuator.

12. The battery-driven working machine according to claim 10,
wherein said voltage control mechanism causes a reduction in power consumed by said actuator.

13. The battery-driven working machine according to claim 10,
wherein said voltage control mechanism causes operation of said actuator to stop when a detected battery capacity is below said preset, lower limit value.

14. The battery-driven working machine according to claim 10,
wherein when the battery capacity value detected by said battery capacity detector is smaller than said preset value and above said preset, lower limit value, said voltage control mechanism causes an operating speed reduction of said actuator, and when the battery capacity value detected by said battery capacity detection means is smaller than said preset, lower limit value, said voltage control mechanism causes operation of said actuator to stop.

15. The battery-driven working machine according to claim 10,
wherein the working machine is a hydraulic excavator.

16. The battery-driven working machine according to claim 15,
wherein said actuator is a hydraulic cylinder for rotating an arm.

17. The battery-driven working machine according to claim 15,
wherein when the battery capacity value detected by said battery capacity detection means is at a level lower than said preset, lower limit value, said actuator operation limiting means causes operation of said hydraulic cylinder to stop.

18. The battery-driven working machine according to claim 10,
wherein said battery capacity detection means detects a specific gravity of battery liquid.

19. The battery-driven working machine according to claim 10,
wherein said battery capacity detection means is a voltmeter.

20. A battery-driven working machine comprising:
a working machine body;
a battery mounted on said working machine body;
an electric motor mounted on said working machine body and driven by electric power from said battery;
a hydraulic pump mounted on said working machine body and operated by said electric motor;
an actuator operated by working oil discharged from said hydraulic pump to operate a working member provided on said working machine body;
a working machine moving means for moving said working machine body by said battery;
an operating lever which is operable between a neutral position for stopping said working member and an operating position at which said working member is operated and when said operating lever is positioned at the operating position, working oil is supplied to said actuator;
a battery capacity detection means for detecting the capacity of said battery;
an actuator operation limiting means for limiting an operation of said actuator and said working machine moving means when said operating lever is operated, in a case where a battery capacity value detected by said battery capacity detection means is at a level lower than a preset value and above a preset, lower limit value; and
wherein when the battery capacity value detected by said battery capacity detection means is smaller than said preset value and above said preset, lower limit value, said actuator operation limiting means causes an operating speed reduction of said actuator, and when the battery capacity value detected by said battery capacity detection means is smaller than said preset, lower limit value, said actuator operation limiting means causes operation of said actuator to stop.

* * * * *